(12) United States Patent
Furutani et al.

(10) Patent No.: US 10,645,819 B2
(45) Date of Patent: May 5, 2020

(54) PRINTED WIRING BOARD

(71) Applicant: IBIDEN CO., LTD., Ogaki (JP)

(72) Inventors: Toshiki Furutani, Ogaki (JP); Takema Adachi, Ogaki (JP); Toshihide Makino, Ogaki (JP); Yasushi Usami, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/233,210

(22) Filed: Dec. 27, 2018

(65) Prior Publication Data

US 2019/0200462 A1 Jun. 27, 2019

(30) Foreign Application Priority Data

Dec. 27, 2017 (JP) .................. 2017-252418

(51) Int. Cl.
*H05K 1/18* (2006.01)
*H05K 3/46* (2006.01)
*H05K 1/11* (2006.01)

(52) U.S. Cl.
CPC .......... *H05K 3/4608* (2013.01); *H05K 1/115* (2013.01); *H05K 1/183* (2013.01); *H05K 1/185* (2013.01); *H05K 3/4602* (2013.01); *H05K 3/4655* (2013.01); *H05K 3/4697* (2013.01); *H05K 3/4652* (2013.01); *H05K 2201/10636* (2013.01); *H05K 2203/0191* (2013.01); *H05K 2203/1469* (2013.01)

(58) Field of Classification Search
CPC ...... H05K 1/183; H05K 1/115; H05K 3/4608; H05K 3/4697
See application file for complete search history.

(56) References Cited

U.S. PATENT DOCUMENTS

| 2007/0030628 | A1* | 2/2007 | Yamamoto | H01G 4/232 361/311 |
| 2010/0006330 | A1* | 1/2010 | Fu | H01L 21/486 174/260 |
| 2014/0355215 | A1* | 12/2014 | Canete | H05K 3/30 361/720 |

(Continued)

FOREIGN PATENT DOCUMENTS

JP 2008-160144 A 7/2008

*Primary Examiner* — Hoa C Nguyen
(74) *Attorney, Agent, or Firm* — Oblon, McClelland, Maier & Neustadt, L.L.P.

(57) ABSTRACT

A printed wiring board includes a core substrate having cavity to accommodate an electronic component and including a front conductor layer formed on front side of the core substrate, and a back conductor layer formed on back side of the core substrate, through-hole conductors formed through the core substrate such that the through-hole conductors connect the front and back conductor layers of the core substrate, a front build-up layer formed on front surface of the core substrate and including interlayer insulating layers and conductor layers, and a back build-up layer formed on back surface of the core substrate and including interlayer insulating layers and conductor layers. The conductor layers in the front build-up layer include a conductor layer sandwiching one of the interlayer insulating layers with the front conductor layer such that the conductor layer and the front conductor layer have the same electric potential in region surrounding the cavity.

20 Claims, 13 Drawing Sheets

(56) References Cited

U.S. PATENT DOCUMENTS

2015/0334842 A1* 11/2015 Shimabe ............ H01L 23/49822
  174/258
2016/0007468 A1*  1/2016 Tomikawa ............ H05K 1/0204
  174/260
2016/0366766 A1* 12/2016 Yeh ........................ H05K 1/184
2016/0374189 A1* 12/2016 Lee ...................... H05K 1/0209

* cited by examiner

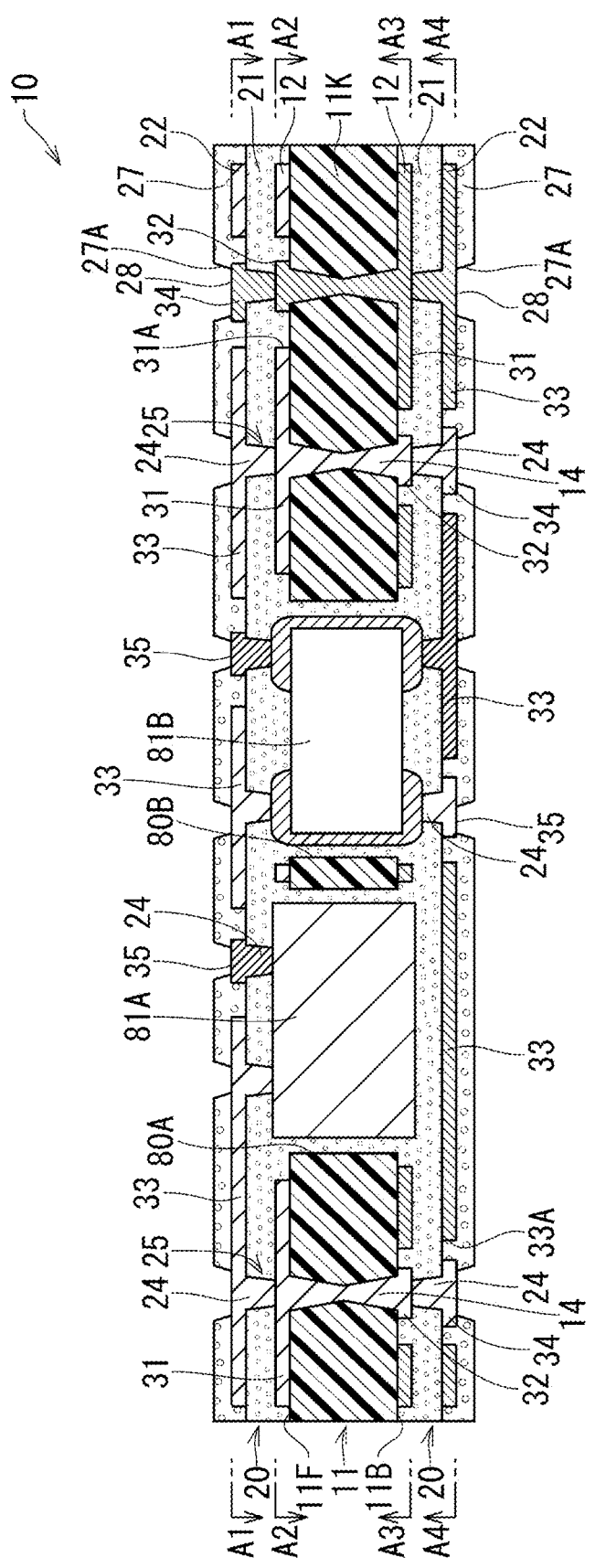

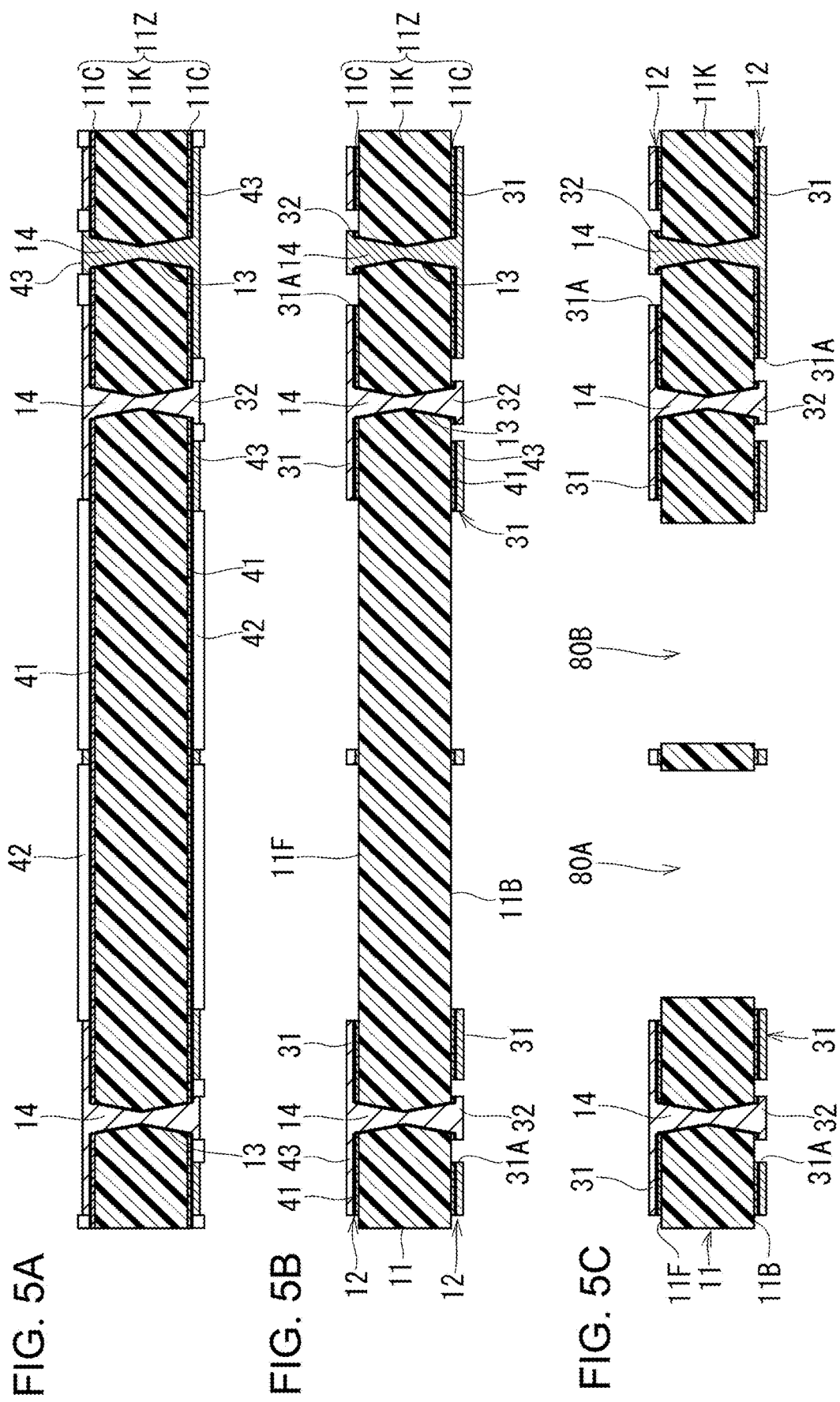

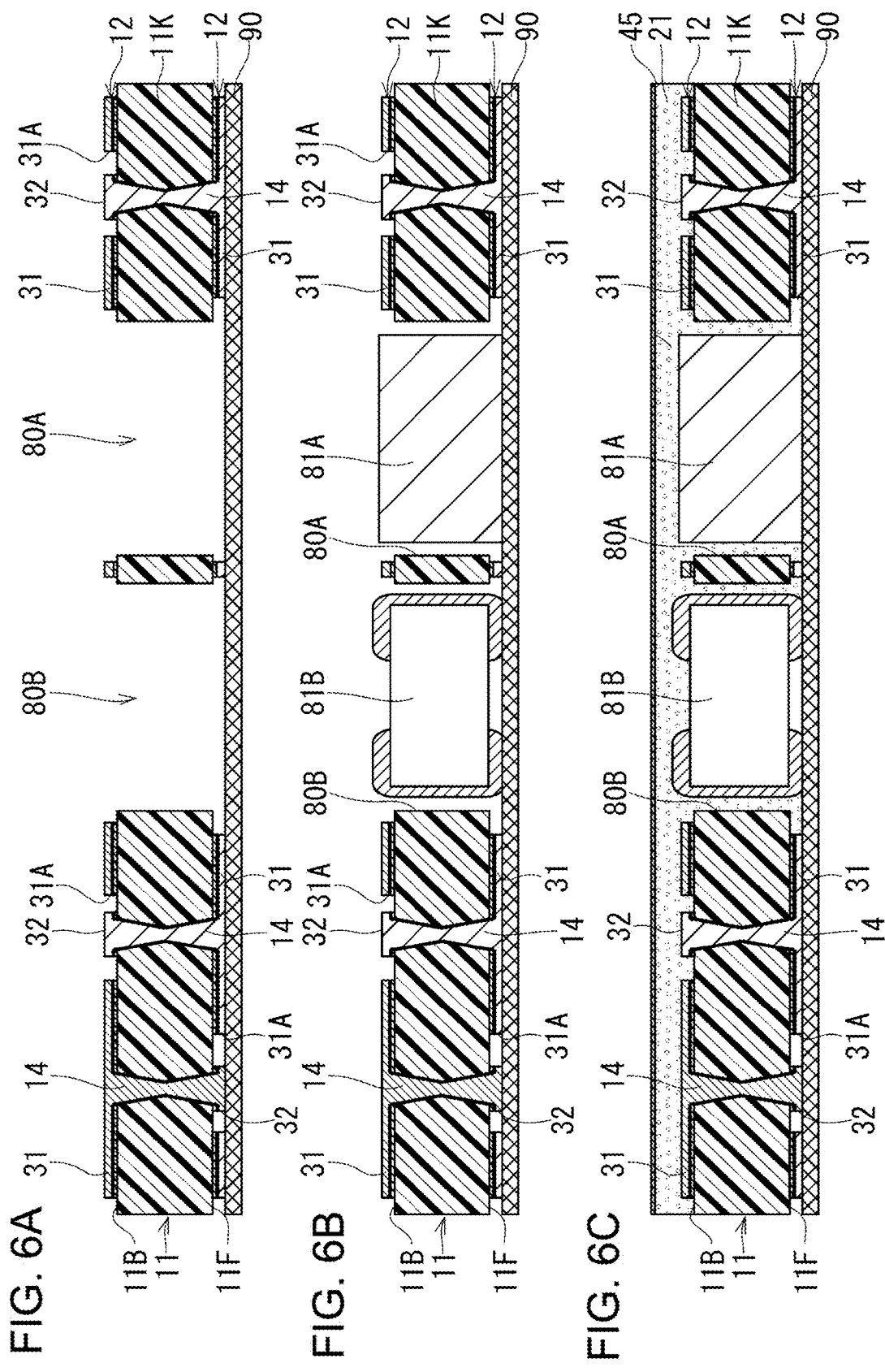

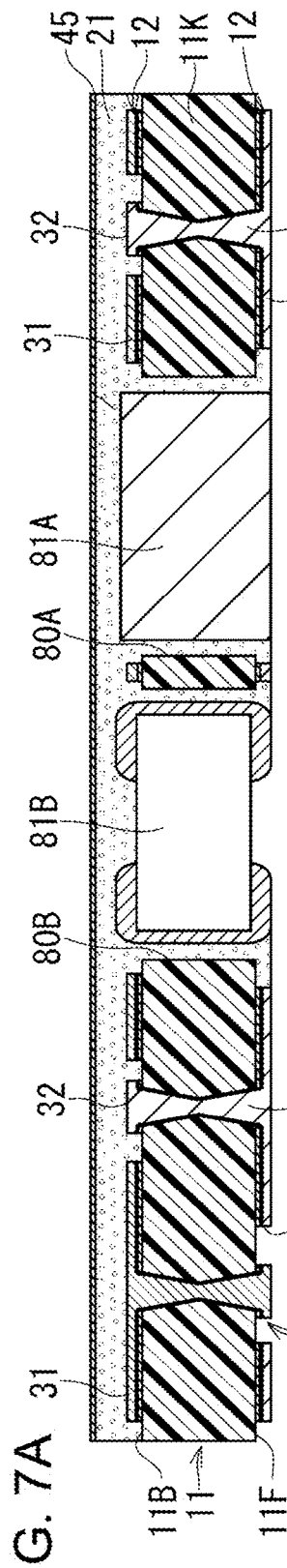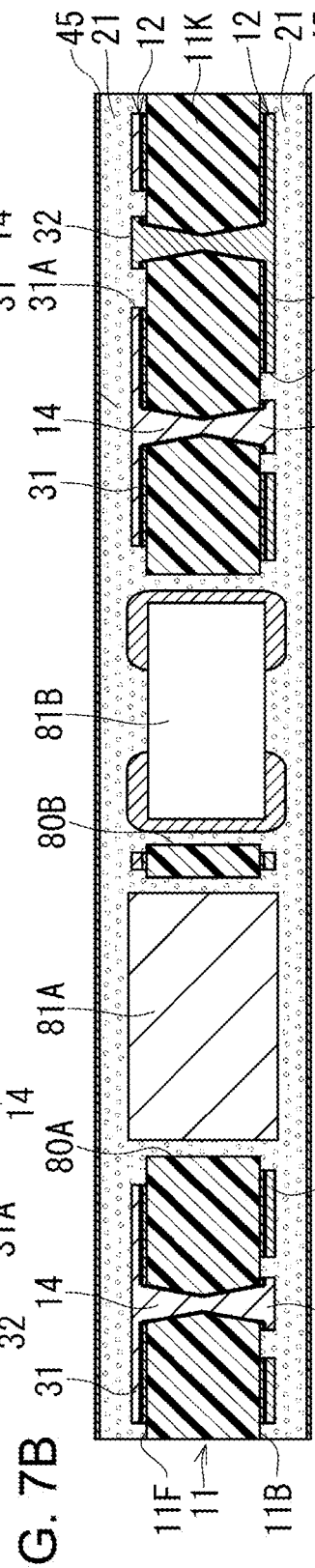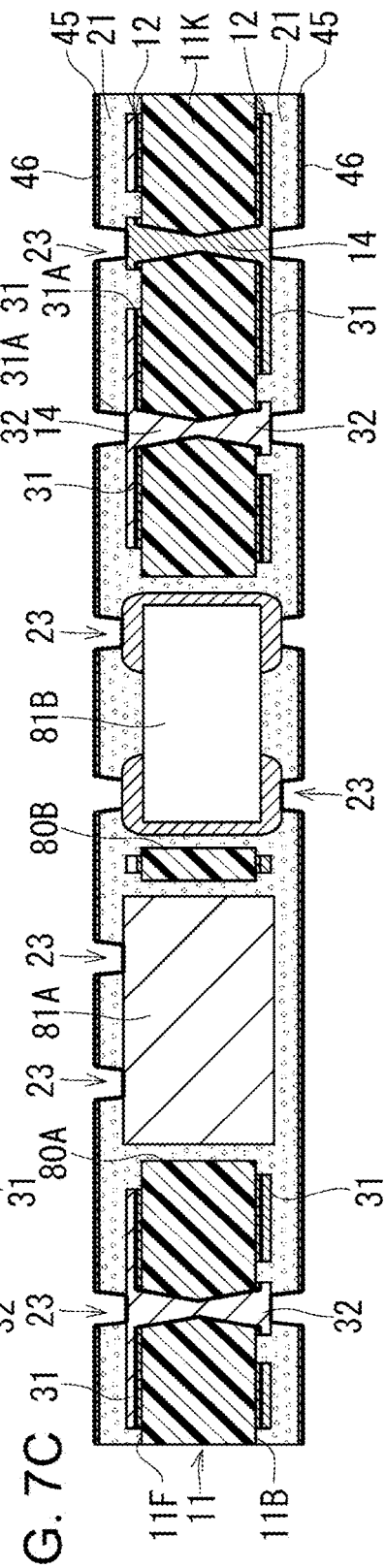

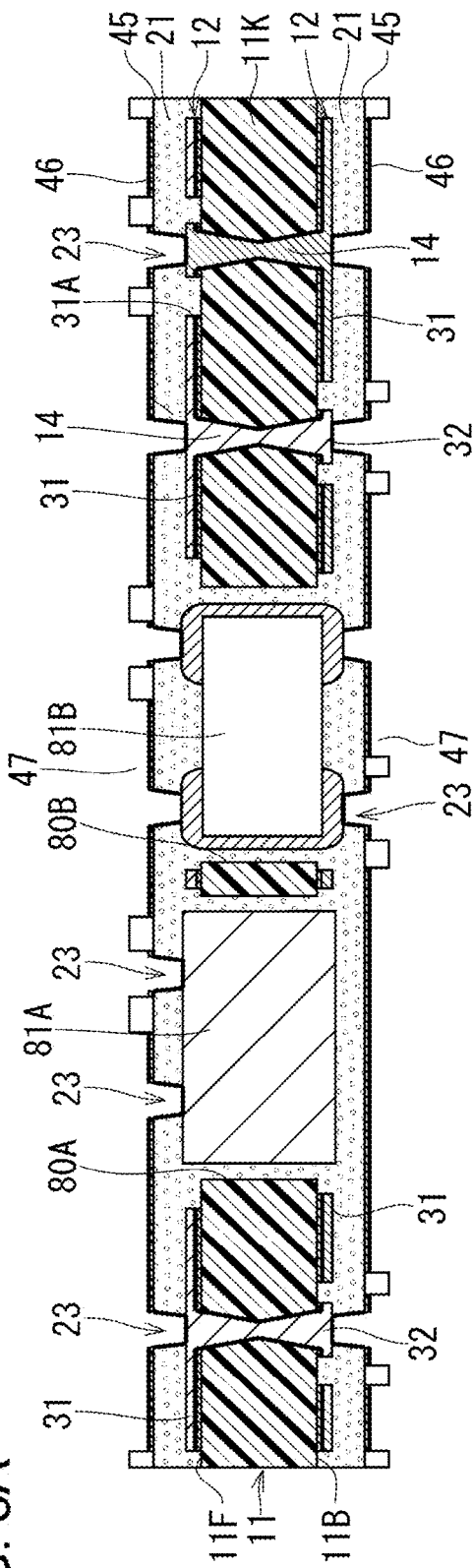

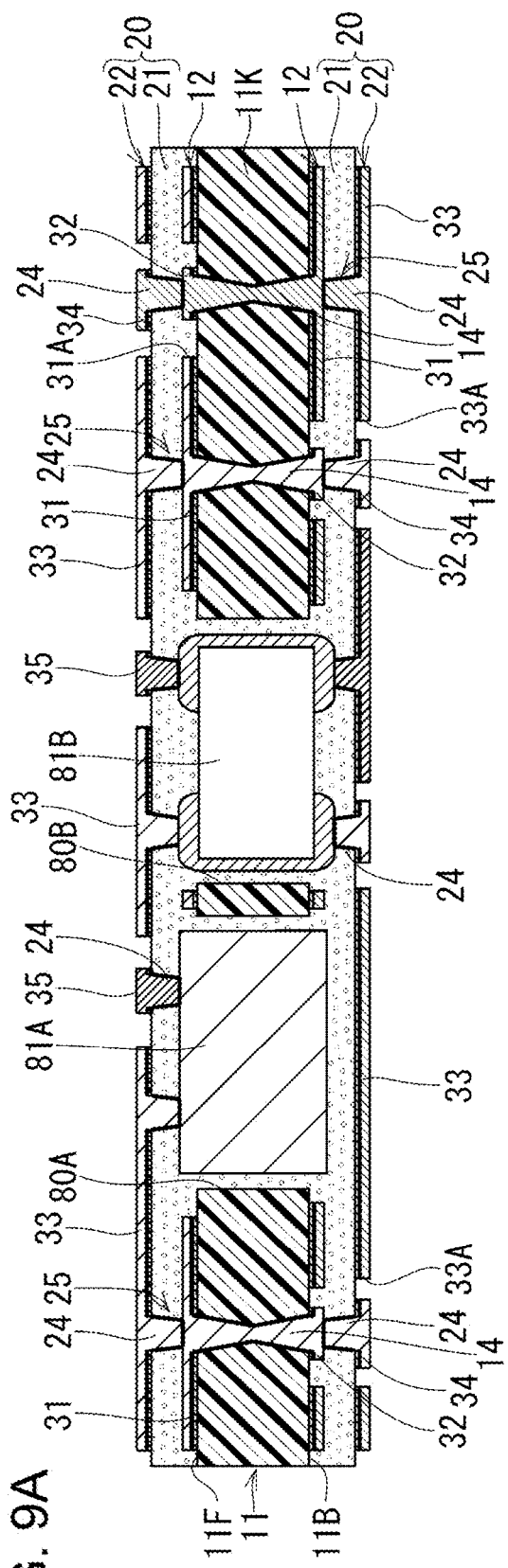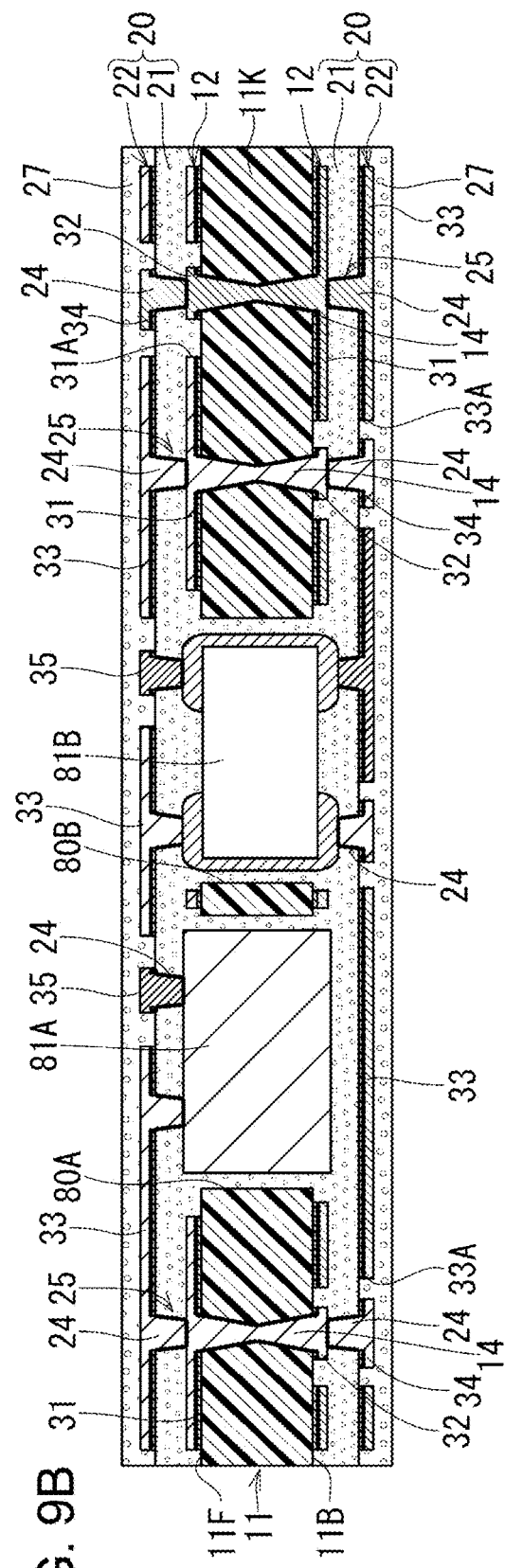

PRINTED WIRING BOARD

CROSS-REFERENCE TO RELATED APPLICATIONS

The present application is based upon and claims the benefit of priority to Japanese Patent Application No. 2017-252418 filed Dec. 27, 2017, the entire contents of which are incorporated herein by reference.

BACKGROUND OF THE INVENTION

Field of the Invention

The present invention relates to a printed wiring board with a built-in electronic component.

Description of Background Art

In a printed wiring board of Japanese Patent Laid-Open Publication No. 2008-160144, interlayer insulating layers and conductor layers are laminated on a core substrate with a built-in electronic component. The entire contents of this publication are incorporated herein by reference.

SUMMARY OF THE INVENTION

According to one aspect of the present invention, a printed wiring board includes a core substrate having a cavity to accommodate an electronic component and including a front conductor layer formed on a front side of the core substrate, and a back conductor layer formed on a back side of the core substrate, through-hole conductors formed through the core substrate such that the through-hole conductors connect the front and back conductor layers of the core substrate, a front build-up layer formed on a front surface of the core substrate and including interlayer insulating layers and conductor layers, and a back build-up layer formed on a back surface of the core substrate and including interlayer insulating layers and conductor layers. The conductor layers in the front build-up layer include a conductor layer sandwiching one of the interlayer insulating layers with the front conductor layer such that the conductor layer and the front conductor layer have the same electric potential in a region surrounding the cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional side view of a printed wiring board according to a first embodiment of the present invention;

FIG. 5A-5C are cross-sectional side views illustrating manufacturing processes of the printed wiring board;

FIG. 6A-6C are cross-sectional side views illustrating manufacturing processes of the printed wiring board;

FIG. 7A-7C are cross-sectional side views illustrating manufacturing processes of the printed wiring board;

FIGS. 8A and 8B are cross-sectional side views illustrating manufacturing processes of the printed wiring board;

FIGS. 9A and 9B are cross-sectional side views illustrating manufacturing processes of the printed wiring board;

DETAILED DESCRIPTION OF THE EMBODIMENTS

Figure 2A:
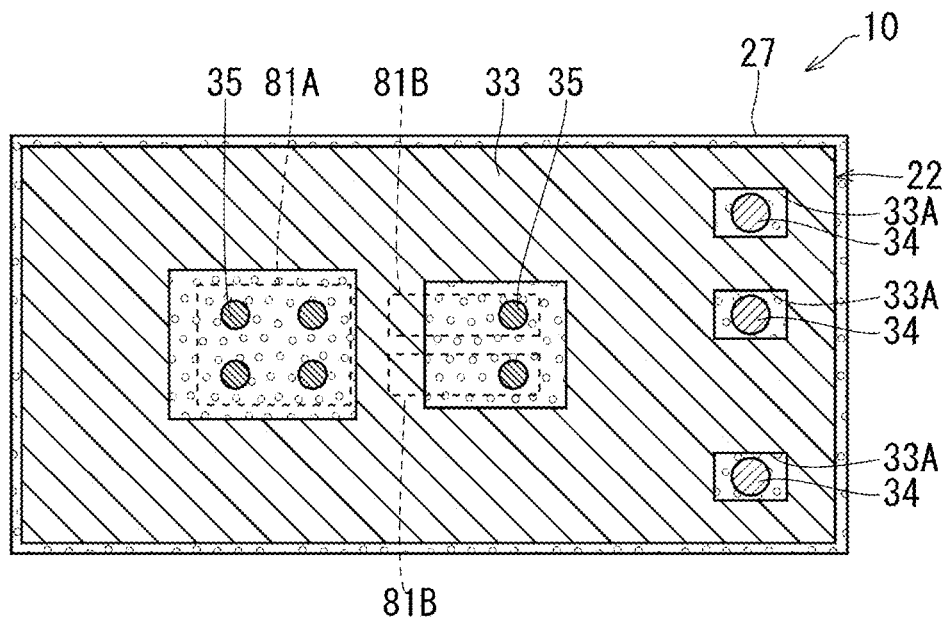
FIG. 2A is an A1-A1 cross-sectional view of the printed wiring board.

Embodiments will now be described with reference to the accompanying drawings, wherein like reference numerals designate corresponding or identical elements throughout the various drawings.

First Embodiment

As illustrated in FIG. 1, a printed wiring board 10 according to the present embodiment has a core substrate 11 and build-up parts 20. The build-up parts 20 are formed by alternately laminating interlayer insulating layers 21 and conductor layers 22, and are respectively formed on an F surface (11F), which is a surface on one of a front side and a back side of the core substrate 11, and a B surface (11B), which is a surface on the other side. Solder resist layers 27 are respectively laminated on the build-up parts 20.

The core substrate 11 has conductor layers (12, 12) respectively on front and back sides of an insulating base material (11K). The insulating base material (11 K) is thicker than each of the interlayer insulating layers 21. The conductor layer 12 on the F surface (11F) side and the conductor layer 12 on the B surface (11B) side are connected to each other by through-hole conductors 14 penetrating the insulating base material (11K). The through-hole conductors 14 are formed by filling through holes 13 penetrating the insulating base material (11K) with plating.

A first cavity (80A) and a second cavity (80B) are formed in the insulating base material (11K). A first electronic component (81A) is accommodated in the first cavity (80A) and a second electronic component (81B) is accommodated in the second cavity (80B). The first electronic component (81A) is, for example, an active element such as a WLP (Wafer Level Package). The second electronic component (81B) is, for example, a multilayer ceramic capacitor (MLCC). A gap between an inner surface of the first cavity (80A) and the first electronic component (81A) and a gap between an inner surface of the second cavity (80B) and the second electronic component (81B) are filled with a resin forming the interlayer resin layers 21 or are filled with a filling resin.

Figure 2B:
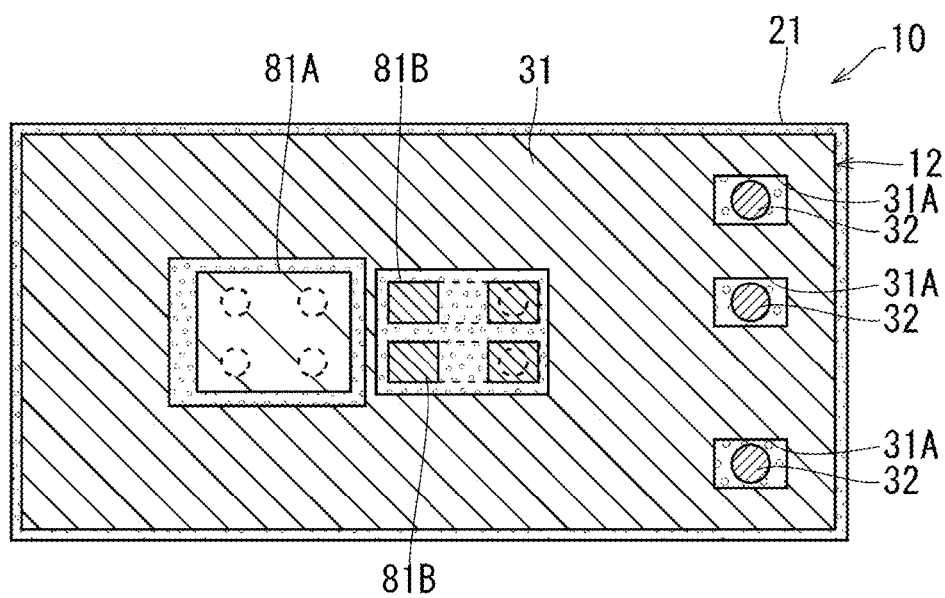
FIG. 2B is an A2-A2 cross-sectional view of the printed wiring board.
Figure 3A:
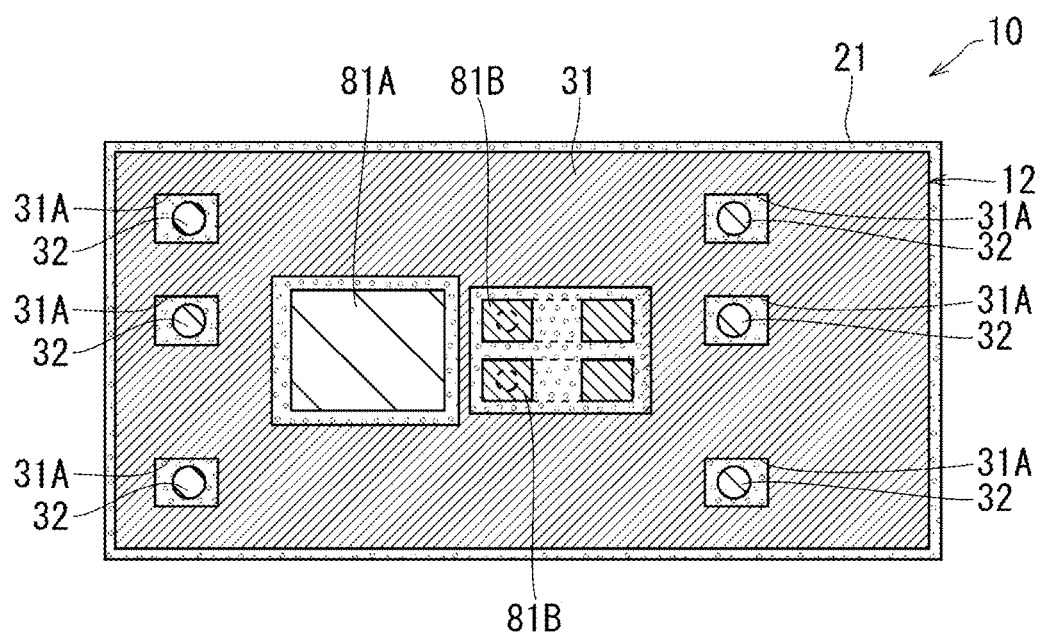
FIG. 3A is an A3-A3 cross-sectional view of the printed wiring board.

As illustrated in FIGS. 2B and 3A, each of the conductor layers 12 has a first conductor layer 31 having multiple opening parts (31A), and has multiple second conductor layers 32 that are respectively arranged inside the multiple opening parts (31A). The first conductor layer 31 is a planar conductor, and the second conductor layers 32 are pad conductors isolated from the planar conductor in the opening parts (31A). The first conductor layer 31 may be formed in the entire conductor layer 12 or may be formed in a portion of the conductor layer 12. When the first conductor layer 31 is formed in a portion of the conductor layer 12, the first conductor layer 31 may be formed in a region surrounding the first cavity (80A) and the second cavity (80B) when viewed from a thickness direction of the printed wiring board 10.

As illustrated in FIG. 1, the first conductor layer 31 of the conductor layer 12 on the F surface (11F) side is connected to the second conductor layers 32 of the conductor layer 12 on the B surface (11B) side by the through-hole conductors 14. Further, the first conductor layer 31 of the conductor layer 12 on the B surface (11B) side is connected to the second conductor layers 32 of the conductor layer 12 on the F surface (11F) side by the through-hole conductors 14. In this way, the through-hole conductors 14 connect to each other the first conductor layers 31 and the second conductor layers 32 arranged on mutually opposite sides on the front and back sides.

Figure 3B:
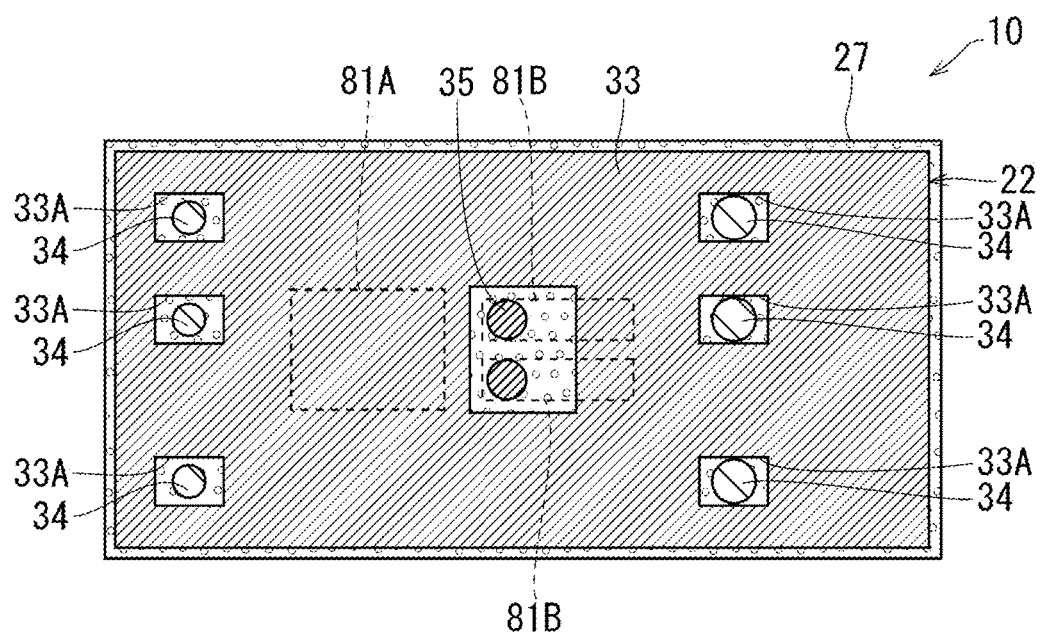
FIG. 3B is an A4-A4 cross-sectional view of the printed wiring board.

As illustrated in FIGS. 2A and 3B, each of the conductor layers 22 of the build-up parts 20 has a third conductor layer 33 having multiple opening parts (33A), and has multiple fourth conductor layers 34 that are respectively arranged inside the multiple opening parts (33A). The third conductor layer 33 is provided corresponding to the first conductor layer 31, and the first conductor layer 31 and the third conductor layer 33 overlap each other in the thickness direction. The fourth conductor layers 34 are respectively provided corresponding to the second conductor layers 32 of the conductor layers 12, and the second conductor layers 32 and the fourth conductor layers 34 respectively overlap each other in the thickness direction. Further, each of the conductor layers 22 has fifth conductor layers 35 overlapping the first electronic component (81A) or the second electronic component (81B) in the thickness direction of the printed wiring board 10.

As illustrated in FIG. 1, the conductor layers 22 of the build-up parts 20 are connected to the conductor layers 12 of the core substrate 11, electrodes of the first electronic component (81A), or electrodes of the second electronic component (81B) by multiple via conductors 24 penetrating the interlayer insulating layers 21. The via conductors 24 are formed by filling via holes 23 penetrating the interlayer insulating layers 21 with plating.

The third conductor layers 33 of the conductor layers 22 are respectively connected to the first conductor layers 31 of the conductor layers 12 via the via conductors 24. Then, the first conductor layer 31 and the third conductor layer 33 arranged on the F surface (11F) side have the same electric potential, and the first conductor layer 31 and the third conductor layer 33 arranged on the B surface (11B) side have the same electric potential. The electric potential of the third conductor layer 33 on the F surface (11F) side and the electric potential of the third conductor layer 33 on the B surface (11B) side are different from each other. In the present embodiment, the third conductor layer 33 on the F surface (11F) side forms a power supply layer and the third conductor layer 33 on the B surface (11B) side forms a ground layer.

The fourth conductor layers 34 of the conductor layers 22 are respectively connected to the second conductor layers 32 of the conductor layers 12 via the via conductors 24. Then, the second conductor layers 32 and the fourth conductor layers 34 arranged on the F surface (11F) side have the same electric potential, and the second conductor layers 32 and the fourth conductor layers 34 arranged on the B surface (11B) side have the same electric potential.

The fifth conductor layers 35 of the conductor layers 22 are connected to the electrodes of the first electronic component (81A) or the electrodes of the second electronic component (81B) via the via conductors 24.

The via conductors 24 include first via conductors (24A) that are respectively linearly stacked on the through-hole conductors 14 to form stack vias 25. In the printed wiring board 10, the outermost conductor layers (22, 22) are connected to each other by the stack vias 25.

As illustrated in FIG. 1, in the solder resist layers 27, multiple openings (27A) exposing the outermost conductor layers 22 of the build-up parts 20 are formed. Then, of the outermost conductor layers 22, portions exposed from the openings (27A) form pads 28.

The printed wiring board 10 is manufactured as follows.

Figure 4A:
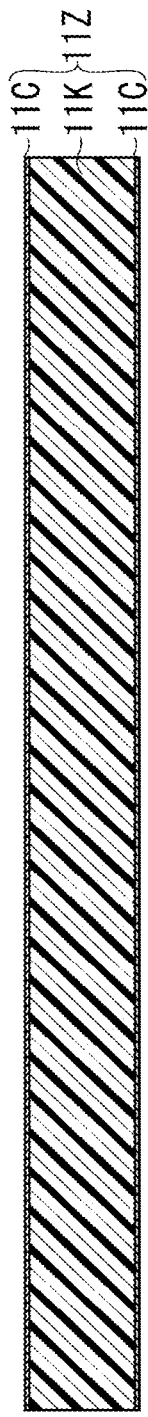
FIG. 4A-4C are cross-sectional side views illustrating manufacturing processes of the printed wiring board.

(1) As illustrated in FIG. 4A, a copper-clad laminated plate (11Z) is prepared in which a copper foil (11C) is laminated on the front and back sides of the insulating base material (11K). The insulating base material (11K) is formed of an epoxy resin or a BT (bismaleimide triazine) resin and a reinforcing material such as a glass cloth.

(2) The through holes 13 are formed by irradiating, for example, CO2 laser from both the F surface (11F) side and the B surface (11B) side of the copper-clad laminated plate (11Z).

Figure 4B:
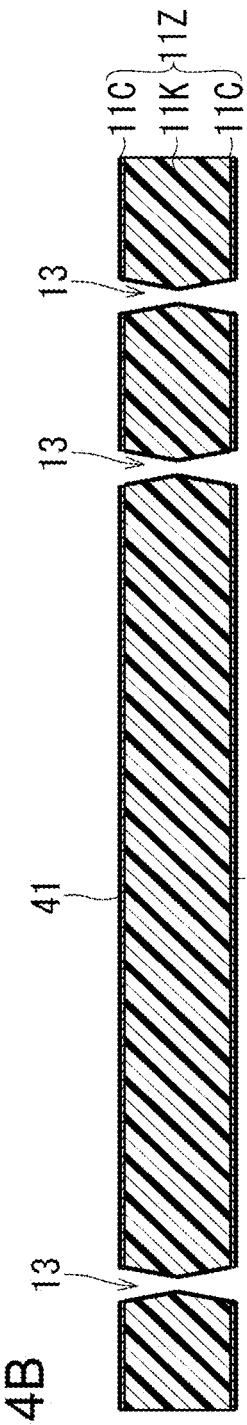

(3) An electroless plating treatment is performed. As illustrated in FIG. 4B, an electroless plating film 41 is formed on the copper foil (11C) and on inner surfaces of the through holes 13 (FIG. 4B).

Figure 4C:
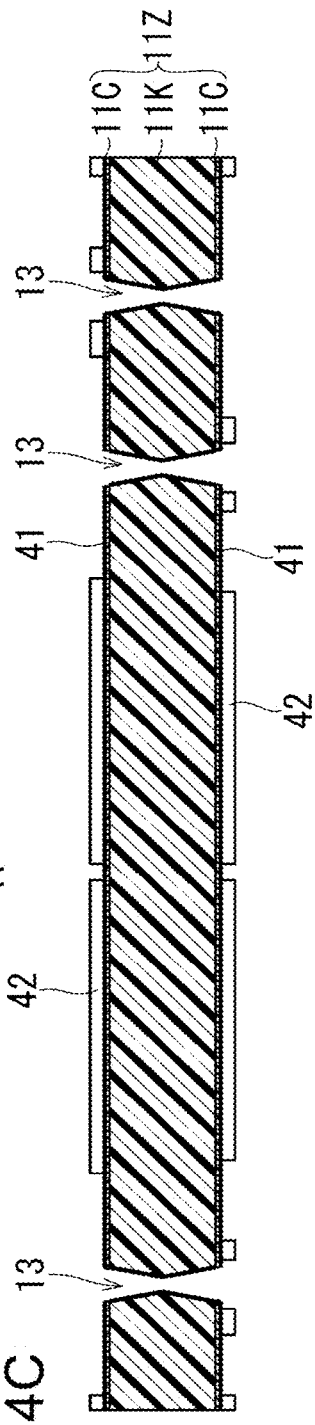

(4) As illustrated in FIG. 4C, a plating resist 42 of a predetermined pattern is formed on the electroless plating film 41.

(5) An electrolytic plating treatment is performed. As illustrated in FIG. 5A, the through-hole conductors 14 are formed by filling the through holes 13 with electrolytic plating, and an electrolytic plating film 43 is formed on portions of the electroless plating film 41 exposed from the plating resist 42.

(6) The plating resist 42 is peeled off, and the electroless plating film 41 and the copper foil (11C) below the plating resist 42 are removed. Then, as illustrated in FIG. 5B, the conductor layers 12 are respectively formed on the front and back sides of the insulating base material (11K) from the copper foil (11C), the electroless plating film 41 and the electrolytic plating film 43, and the front side conductor layer 12 and the back side conductor layer 12 are connected to each other by the through-hole conductors 14. As a result, the core substrate 11 is formed.

(7) As illustrated in FIG. 5C, the first cavity (80A) and the second cavity (80B) are formed in the core substrate 11 by router processing or laser processing.

(8) As illustrated in FIG. 6A, a tape 90 is affixed to the F surface (11F) of the core substrate 11, and the first cavity (80A) and the second cavity (80B) are closed.

(9) As illustrated in FIG. 6B, the first electronic component (81A) is accommodated in the first cavity (80A) and the second electronic component (81B) is accommodated in the second cavity (80B) using a mounter (not illustrated in the drawings).

(10) As illustrated in FIG. 6C, the interlayer insulating layer 21 and a copper foil 45 are laminated on the B surface (11B) of the core substrate 11, and hot pressing is performed. As the interlayer insulating layer 21, a prepreg containing an inorganic filler (a B stage resin sheet obtained by impregnating a core material with a resin containing an inorganic filler) is used. In this case, gaps between portions of the conductor layer 12 on the B surface (11B) side of the core substrate 11 are filled with the prepreg. Further, a thermosetting resin exuded from the prepreg enters into the gap between the inner surface of the first cavity (80A) and the first electronic component (81A) and the gap between the inner surface of the second cavity (80B) and the second electronic component (81B).

(11) As illustrated in FIG. 7A, the tape 90 is peeled off.

(12) As illustrated in FIG. 7B, a prepreg as the interlayer resin layer 21 and a copper foil 45 are laminated on the F surface (11F) of the core substrate 11, and hot pressing is performed. In this case, gaps between portions of the conductor layer 12 on the F surface (11F) side of the core substrate 11 are filled with the prepreg.

(13) The multiple via holes 23 are formed by irradiating laser to the copper foil 45 and the interlayer resin layer 21 on the F surface (11F) side and to the copper foil 45 and the interlayer resin layer 21 on the B surface (11B) side.

(14) An electroless plating treatment is performed. An electroless plating film 46 is formed on the copper foils 45 and in the via holes 23 (FIG. 7C).

(15) As illustrated in FIG. 8A, a plating resist 47 of a predetermined pattern is formed on the electroless plating film 46.

(16) An electrolytic plating treatment is performed. As illustrated in FIG. 8B, the via conductors 24 are formed by filling the via holes 23 with electrolytic plating, and an electrolytic plating film 48 is formed on portions of the electroless plating film 46 exposed from the plating resist 47.

(17) The plating resist 47 is peeled off, and the electroless plating film 46 and the copper foils 45 below the plating resist 47 are removed. Then, as illustrated in FIG. 9A, the conductor layers 22 are respectively formed on the interlayer insulating layers 21 from the copper foils 45, the electroless plating film 46 and the electrolytic plating film 48. The conductor layers 22 are connected to the electrodes of the first electronic component (81A) or the electrodes of the second electronic component (81B) by the via conductors 24.

As an interlayer insulating layer 21, instead of a prepreg, it is also possible to use a resin film that does not contain a core material but contains an inorganic filler. In this case, a copper foil 45 is not laminated and a conductor layer 22 is formed on the resin film using a semi-additive method.

(18) As illustrated in FIG. 9B, the solder resist layers 27 are respectively laminated on the conductor layers 22.

Figure 10:
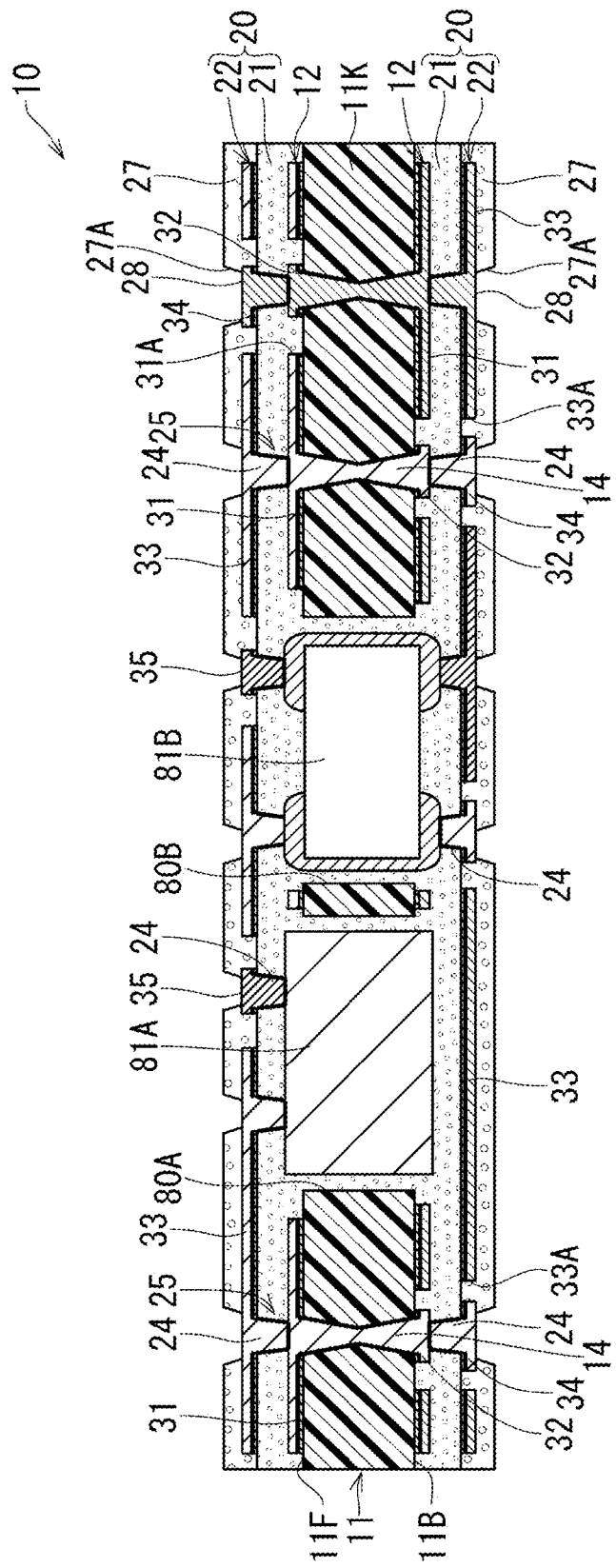
FIG. 10 is a cross-sectional side view illustrating a manufacturing process of the printed wiring board.
Figure 11:
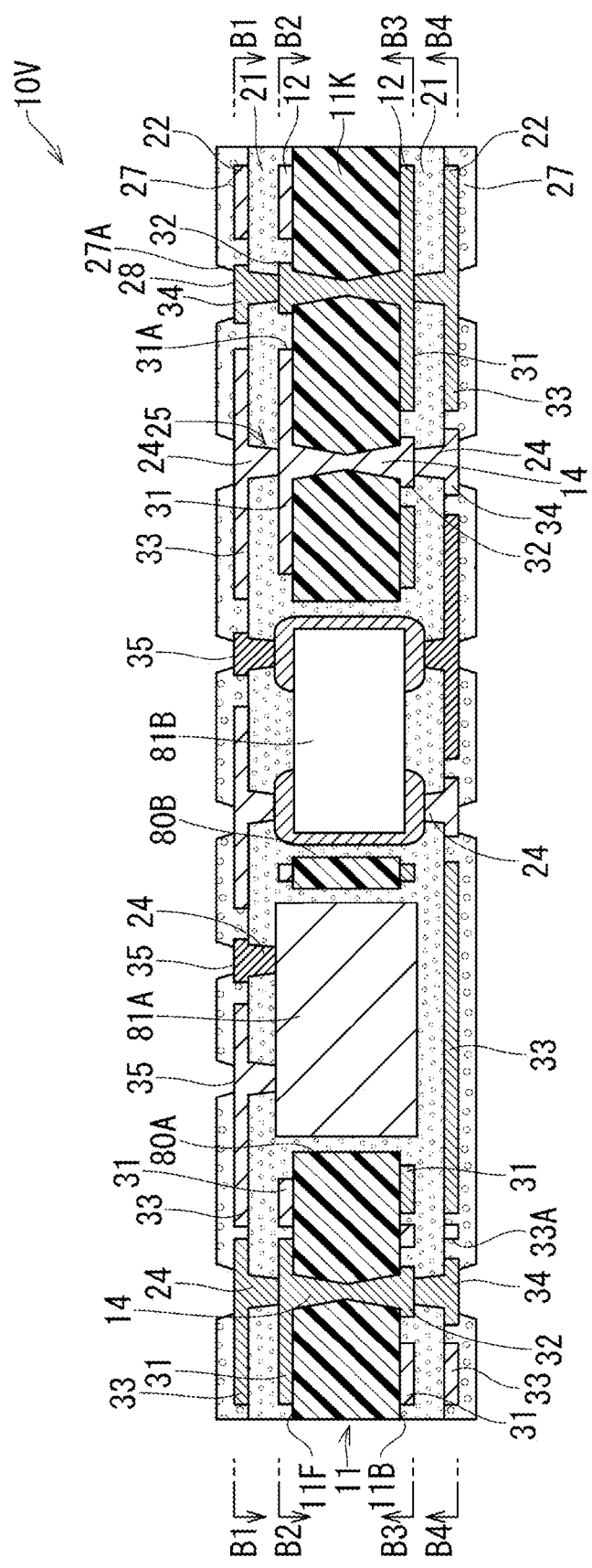
FIG. 11 is a cross-sectional side view of a printed wiring board according to a second embodiment of the present invention.
Figure 12A:
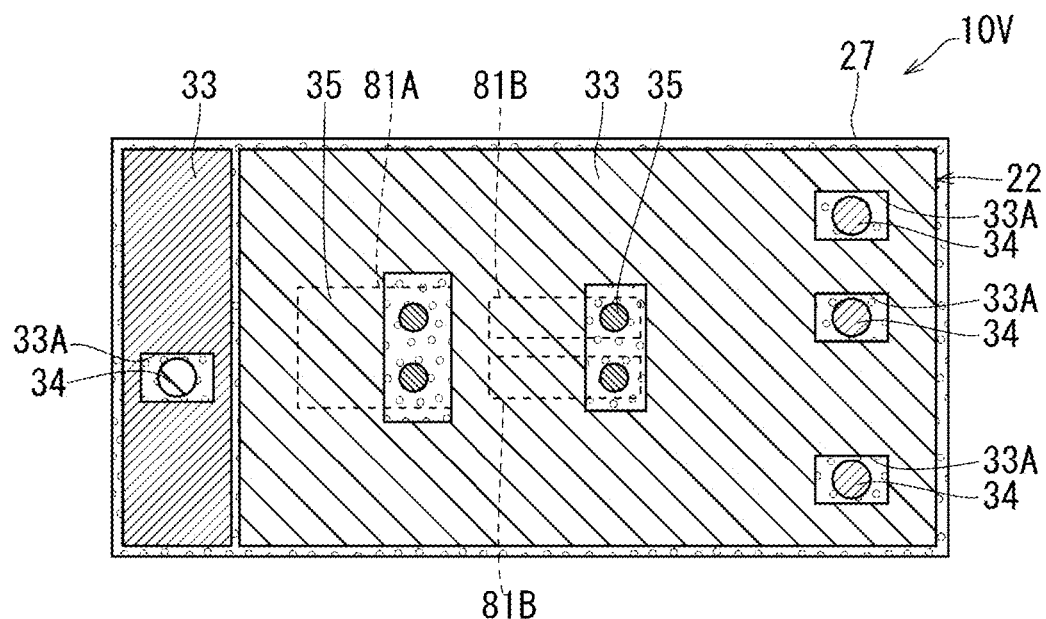
FIG. 12A is a B1-B1 cross-sectional view of the printed wiring board.
Figure 12B:
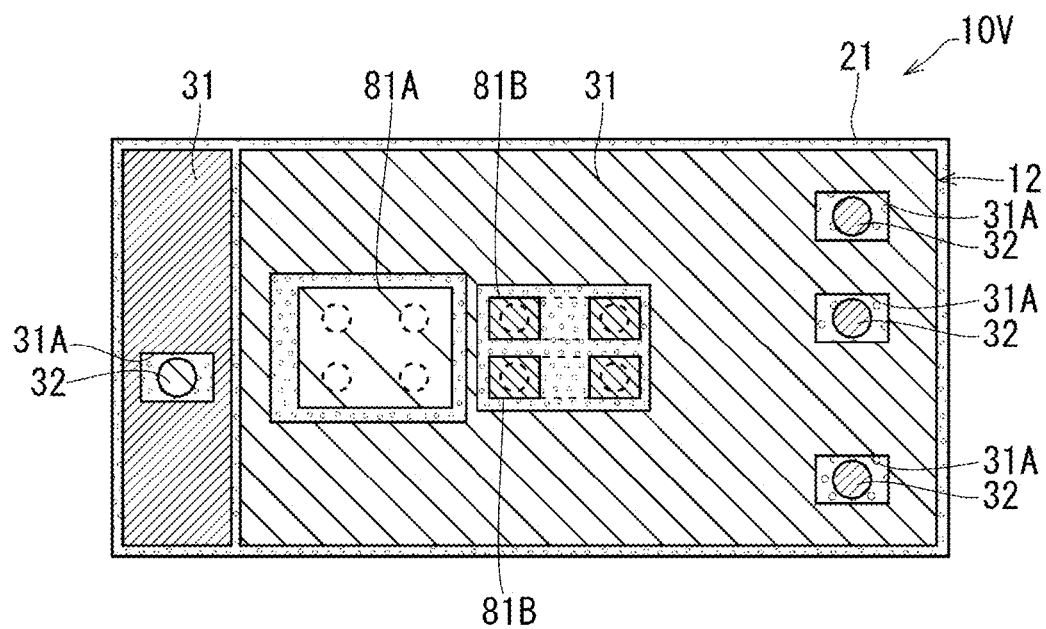
FIG. 12B is a B2-B2 cross-sectional view of the printed wiring board.
Figure 13A:
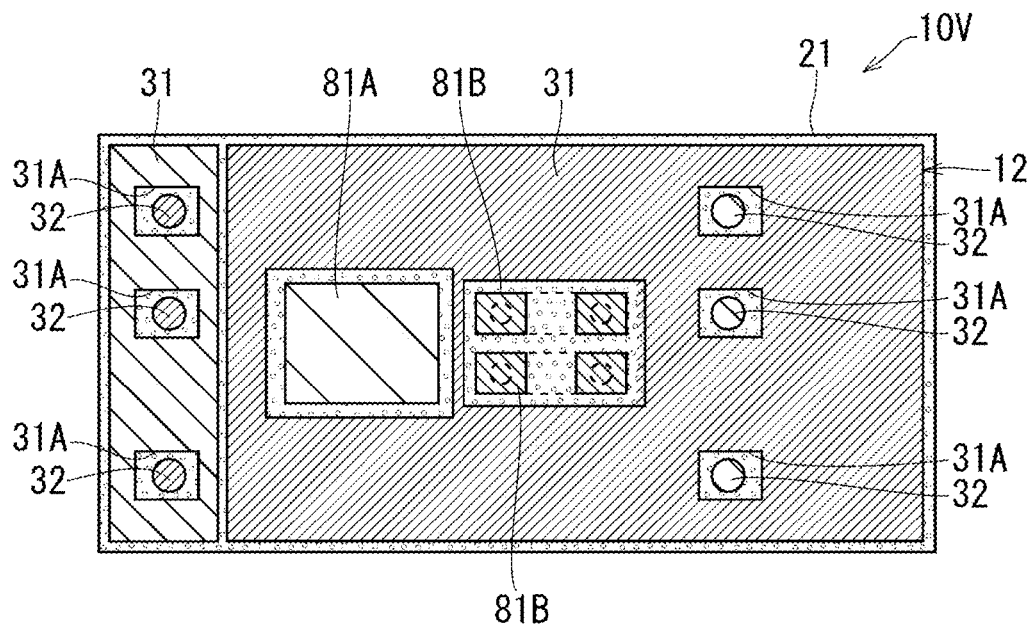
FIG. 13A is a B3-B3 cross-sectional view of the printed wiring board.
Figure 13B:
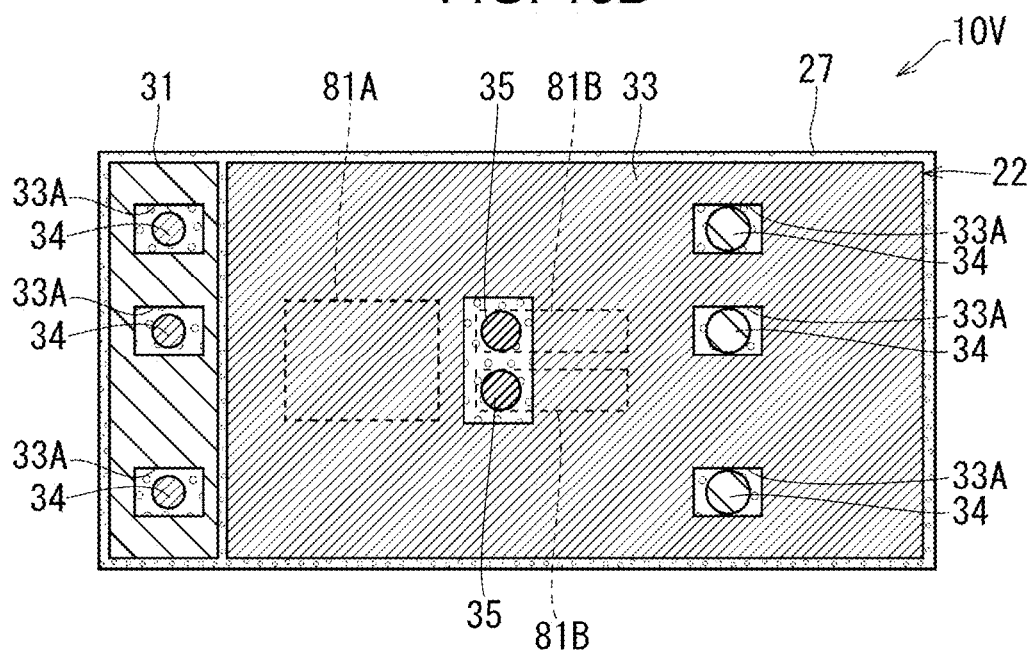
FIG. 13B is a B4-B4 cross-sectional view of the printed wiring board.

(19) As illustrated in FIG. 10, the openings (27A) are formed at predetermined places of the solder resist layers 27 by exposure and development. Then, the pads 28 are formed by portions of the conductor layers 22 exposed from the openings (27A). As a result, the printed wiring board 10 illustrated in FIG. 1 is completed.

According to the printed wiring board 10, the first conductor layer 31 and the third conductor layer 33 sandwiching the interlayer insulating layer 21 therebetween have the same electric potential. Therefore, occurrence of an interlayer short circuit between the first conductor layer 31 and the third conductor layer 33 is suppressed. As a result, the interlayer insulating layers 21 can be reduced in thickness. In addition, the first conductor layer 31 and the third conductor layer 33 are arranged in a region surrounding the first cavity (80A) and the second cavity (80B) when viewed from the thickness direction. Therefore, it is possible to suppress problems of the first electronic component (81A) and the second electronic component (81B) caused by an interlayer short circuit.

Further, in the present embodiment, two conductor layers having different electric potentials, that is, the first conductor layer 31 on the F surface (11F) side and the first conductor layer 31 on the B surface (11B) side are arranged sandwiching therebetween the insulating base material (11K) which is thicker than each of the interlayer insulating layers 21. Therefore, an interlayer short circuit between the conductor layers having different electric potentials is suppressed.

Further, in the present embodiment, the first conductor layers 31 and the second conductor layers 32 that are arranged on the opposite sides on the front and back sides are connected by the through-hole conductors 14, and the second conductor layers 32 and the fourth conductor layers 34 are connected by the first via conductors (24A) that are respectively linearly stacked on the through-hole conductors 14. Then, the conductor layers arranged on the outermost front and back sides (for example, the fourth conductor layers 34 on the F surface (11F) side and the second conductor layer 33 on the B surface (11B) side) are connected to each other by the stack vias 25. According to this structure, in each of the conductor layers 12, spreading of the second conductor layers 32 having an electric potential different from that of the first conductor layer 31 can be suppressed, and, in each of the conductor layers 22, spreading of the fourth conductor layers 34 having an electric potential different from that of the third conductor layer 33 can be suppressed.

Second Embodiment

As illustrated in FIG. 11-13B, in a printed wiring board (10V) of the present embodiment, in each of the conductor layers 12, multiple first conductor layers 31 are formed, and, in each of the conductor layers 22, multiple third conductor layers 33 are formed. When viewed from the thickness direction of the printed wiring board (10V), a boundary between the first conductor layers 31 and a boundary between the third conductor layers 33 substantially coincide with each other. The boundary between the first conductor layers 31 does not overlap the first cavity (80A) and the second cavity (80B). Similarly, the boundary between the third conductor layers 33 does not overlap the first cavity (80A) and the second cavity (80B). In the present embodiment, one of the first conductor layers 31 and one of the third conductor layers 33 are arranged directly above the first cavity (80A) and the second cavity (80B).

Electric potentials of two adjacent third conductor layers (33, 33) on the F surface (11F) side are different from each other. In the present embodiment, among two adjacent third conductor layers (33, 33), one third conductor layer 33 forms a power supply layer, and the other third conductor layer 33 forms a ground layer.

Other structures of the printed wiring board (10V) are the same as the above-described printed wiring board 10 of the first embodiment. According to the printed wiring board (10V) of the present embodiment, the same effect as the above-described printed wiring board 10 of the first embodiment can be achieved. The printed wiring board (10V) is manufactured in the same way as the above-described printed wiring board 10 of the first embodiment.

Other Embodiments (1) In the above-described embodiments, the build-up parts 20 may each have a structure in which multiple interlayer insulating layers 21 and multiple conductor layers 22 are alternately laminated. In this structure, third conductor layers (33, 33) sandwiching an interlayer insulating layer 21 have the same electric potential, and fourth conductor layers (34, 34) sandwiching interlayer insulating layers (21, 21) have the same electric potential.

(2) In the above-described embodiments, it is possible that there is only one electronic component or there are three or more electronic components. Further, in the above-described embodiments, one electronic component is accommodated in one cavity. However, it is also possible that multiple electronic components are accommodated in one cavity.

(3) In the above-described second embodiment, it is also possible that a first conductor layer 31 different from a first conductor layer 31 arranged directly above the first cavity (80A) is arranged directly above the second cavity (80B), and electric potentials of these first conductor layers (31, 31) are different from each other.

In the printed wiring board of Japanese Patent Laid-Open Publication No. 2008-160144, it is thought that there is a problem that a short circuit (interlayer short circuit) may occur between conductor layers sandwiching an interlayer insulating layer.

A printed wiring board according to an embodiment of the present invention is capable of suppressing occurrence of an interlayer short circuit.

A printed wiring board according to an embodiment of the present invention includes: a core substrate having conductor layers respectively on front and back sides thereof and having a cavity accommodating an electronic component; through-hole conductors connecting to each other the conductor layers on the front and back sides of the core substrate; and build-up parts respectively formed on front and back surfaces of the core substrate by alternately laminating interlayer insulating layers and conductor layers. Then, when viewed from a thickness direction of the printed wiring board, in a region surrounding the cavity, conductor layers sandwiching an interlayer insulating layer have the same electric potential.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a core substrate having a cavity configured to accommodate an electronic component and comprising a front conductor layer formed on a front side of the core substrate, and a back conductor layer formed on a back side of the core substrate;
a plurality of through-hole conductors formed through the core substrate such that the plurality of through-hole conductors connect the front and back conductor layers of the core substrate;
a front build-up layer formed on a front surface of the core substrate and comprising a plurality of interlayer insulating layers and a plurality of conductor layers; and
a back build-up layer formed on a back surface of the core substrate and comprising a plurality of interlayer insulating layers and a plurality of conductor layers,
wherein the plurality of conductor layers in the front build-up layer includes a conductor layer sandwiching one of the interlayer insulating layers with the front conductor layer such that the conductor layer and the front conductor layer have a same electric potential in a region surrounding the cavity, each of the front and back conductor layers in the core substrate includes a first conductor layer having a planar shape and an opening portion, and a second conductor layer formed inside the opening portion and isolated from the first conductor layer by the one opening portion, and the through-hole conductors are connecting the first conductor layer of the front conductor layer and the second conductor layer of the back conductor layer and the first conductor layer of the back conductor layer and the second conductor layer of the front conductor layer such that the first conductor layer of the front conductor layer and the first conductor layer of the back conductor layer have different electric potentials with respect to each other.

2. The printed wiring board according to claim 1, wherein each of the front and back build-up layers has a plurality of via conductors such that the plurality of via conductors is connecting the conductor layers through the interlayer insulating layers and includes a plurality of first via conductors linearly stacked on a respective one of the through-hole conductors, and each of the front and back build-up layers has an outermost conductor layer such that the outermost conductor layer in the front build-up layer is connected to the outermost conductor layer of the back build-up layer via the through-hole conductors and the first via conductors.

3. The printed wiring board according to claim 2, wherein each of the front and back build-up layers includes one of the conductor layers formed such that the one of the conductor layers includes a third conductor layer corresponding to the first conductor layer and a plurality of fourth conductor layers corresponding to the second conductor layer and formed inside at least one opening portion formed in the third conductor layer, and the first conductor layer of the core substrate on one of the front and back conductor layers is connected to the third conductor layer of the one of the front and back conductor layers via the via conductors and is not connected to the third conductor layer of the other one of the front and back conductor layers.

4. The printed wiring board according to claim 3, wherein the first conductor layer formed in each of the front and back conductor layers of the core substrate is formed in a plurality such that the plurality of first conductor layers has adjacent first conductor layers having different electric potentials.

5. The printed wiring board according to claim 2, wherein the first conductor layer formed in each of the front and back conductor layers of the core substrate is formed in a plurality such that the plurality of first conductor layers has adjacent first conductor layers having different electric potentials.

6. The printed wiring board according to claim 2, wherein each of the front and back build-up layers includes one of the conductor layers formed such that the one of the conductor layers includes a third conductor layer corresponding to the first conductor layer and a fourth conductor layer corresponding to the second conductor layer and formed inside an opening portion formed in the third conductor layer, and the first conductor layer of the core substrate on one of the front and back conductor layers is connected to the third conductor layer of the one of the front and back conductor layers via the via conductors and is not connected to the third conductor layer of the other one of the front and back conductor layers.

7. The printed wiring board according to claim 2, wherein each of the front and back build-up layers includes one of the conductor layers formed such that the one of the conductor layers includes a third conductor layer corresponding to the first conductor layer and a plurality of fourth conductor layers corresponding to the second conductor layer and formed inside at least one opening portion formed in the third conductor layer.

8. The printed wiring board according to claim 2, wherein each of the front and back build-up layers includes one of the conductor layers formed such that the one of the conductor layers includes a third conductor layer corresponding to the first conductor layer and a fourth conductor layer corresponding to the second conductor layer and formed inside an opening portion formed in the third conductor layer.

9. The printed wiring board according to claim 1, wherein the first conductor layer formed in each of the front and back conductor layers of the core substrate is formed in a plurality such that the plurality of first conductor layers has adjacent first conductor layers having different electric potentials.

10. The printed wiring board according to claim 9, wherein each of the front and back build-up layers has a plurality of via conductors such that the plurality of via conductors is connecting the conductor layers through the interlayer insulating layers.

11. The printed wiring board according to claim 9, wherein each of the front and back build-up layers includes one of the conductor layers formed such that the one of the conductor layers includes a third conductor layer corresponding to the first conductor layer and a plurality of fourth conductor layers corresponding to the second conductor layer and formed inside at least one opening portion formed in the third conductor layer.

12. The printed wiring board according to claim 9, wherein each of the front and back build-up layers includes one of the conductor layers formed such that the one of the conductor layers includes a third conductor layer corresponding to the first conductor layer and a fourth conductor layer corresponding to the second conductor layer and formed inside an opening portion formed in the third conductor layer.

13. The printed wiring board according to claim 9, wherein each of the front and back build-up layers has a plurality of via conductors such that the plurality of via conductors is connecting the conductor layers through the interlayer insulating layers and includes a plurality of first via conductors linearly stacked on a respective one of the through-hole conductors, and each of the front and back build-up layers has an outermost conductor layer such that the outermost conductor layer in the front build-up layer is connected to the outermost conductor layer of the back build-up layer via the through-hole conductors and the first via conductors.

14. The printed wiring board according to claim 1, wherein each of the front and back build-up layers has a plurality of via conductors such that the plurality of via conductors is connecting the conductor layers through the interlayer insulating layers.

15. The printed wiring board according to claim 1, wherein each of the front and back build-up layers includes one of the conductor layers formed such that the one of the conductor layers includes a third conductor layer corresponding to the first conductor layer and a plurality of fourth conductor layers corresponding to the second conductor layer and formed inside at least one opening portion formed in the third conductor layer.

16. The printed wiring board according to claim 1, wherein each of the front and back build-up layers includes one of the conductor layers formed such that the one of the conductor layers includes a third conductor layer corresponding to the first conductor layer and a fourth conductor layer corresponding to the second conductor layer and formed inside an opening portion formed in the third conductor layer.

17. The printed wiring board according to claim 1, wherein the first conductor layer formed in each of the front and back conductor layers of the core substrate is formed in a plurality.

18. The printed wiring board according to claim 17, wherein each of the front and back build-up layers has a plurality of via conductors such that the plurality of via conductors is connecting the conductor layers through the interlayer insulating layers and includes a plurality of first via conductors linearly stacked on a respective one of the through-hole conductors, and each of the front and back build-up layers has an outermost conductor layer such that the outermost conductor layer in the front build-up layer is connected to the outermost conductor layer of the back build-up layer via the through-hole conductors and the first via conductors.

19. The printed wiring board according to claim 1, wherein the plurality of conductor layers in the back build-up layer includes a conductor layer sandwiching one of the interlayer insulating layers with the back conductor layer such that the conductor layer and the back conductor layer have a same electric potential in a region surrounding the cavity.

20. The printed wiring board according to claim 1, further comprising:
the electronic component accommodated in the cavity of the core substrate.

* * * * *